United States Patent
Matsui et al.

(10) Patent No.: US 8,945,313 B2
(45) Date of Patent: Feb. 3, 2015

(54) VACUUM EXHAUST METHOD AND A SUBSTRATE PROCESSING APPARATUS THEREFOR

(71) Applicant: Tokyo Electron Limited, Minato-ku (JP)

(72) Inventors: Hidefumi Matsui, Nirasaki (JP); Tsuyoshi Moriya, Tokyo (JP); Nobuyuki Nagayama, Nirasaki (JP)

(73) Assignee: Tokyo Electron Limited, Minato-ku (JP)

( * ) Notice: Subject to any disclaimer, the term of this patent is extended or adjusted under 35 U.S.C. 154(b) by 0 days.

(21) Appl. No.: 13/690,826

(22) Filed: Nov. 30, 2012

(65) Prior Publication Data

US 2013/0092185 A1   Apr. 18, 2013

Related U.S. Application Data

(62) Division of application No. 12/606,569, filed on Oct. 27, 2009, now abandoned.

(30) Foreign Application Priority Data

Oct. 27, 2008   (JP) .................. 2008-276028

(51) Int. Cl.
| | | |
|---|---|---|
| *B08B 5/04* | (2006.01) | |
| *B08B 7/04* | (2006.01) | |
| *C23C 16/44* | (2006.01) | |
| *B08B 6/00* | (2006.01) | |
| *B08B 7/00* | (2006.01) | |

(52) U.S. Cl.
CPC .............. *B08B 7/04* (2013.01); *C23C 16/4401* (2013.01); *C23C 16/4412* (2013.01); *B08B 5/04* (2013.01); *B08B 6/00* (2013.01); *B08B 7/0035* (2013.01)

USPC .................. 134/21; 134/6; 134/10; 134/22.1; 134/22.12

(58) Field of Classification Search
CPC .................................................. Y10S 156/915
See application file for complete search history.

(56) References Cited

U.S. PATENT DOCUMENTS

| | | | |
|---|---|---|---|
| 5,112,185 A | 5/1992 | Koike | |
| 5,520,002 A * | 5/1996 | Ishikawa | 62/55.5 |
| 6,310,327 B1 | 10/2001 | Moore et al. | |
| 6,312,569 B1 | 11/2001 | Suzuki et al. | |
| 7,067,178 B2 | 6/2006 | Muto et al. | |
| 2003/0159778 A1 | 8/2003 | Koroyasu et al. | |
| 2004/0040662 A1 | 3/2004 | Edamura et al. | |
| 2004/0256215 A1 | 12/2004 | Stebbins et al. | |
| 2005/0039773 A1 * | 2/2005 | Moriya et al. | 134/1.2 |
| 2006/0065254 A1 * | 3/2006 | Okabe et al. | 123/557 |

FOREIGN PATENT DOCUMENTS

| | | |
|---|---|---|
| JP | 8-255784 | 10/1996 |
| KR | 10-2005-0102378 | 10/2005 |
| KR | 10-2007-0026241 | 3/2007 |

OTHER PUBLICATIONS

Korean Office Action issued Mar. 25, 2011, in Patent Application No. 10-2009-0102313 (with English-language translation).

* cited by examiner

*Primary Examiner* — Michael Kornakov
*Assistant Examiner* — Ryan Coleman
(74) *Attorney, Agent, or Firm* — Oblon, Spivak, McClelland, Maier & Neustadt, L.L.P.

(57) ABSTRACT

A vacuum exhaust method of a substrate processing apparatus, after opening to the atmosphere, depressurizes a vacuum processing chamber having therein a mounting table for mounting a target substrate thereon. The vacuum exhaust method includes covering a surface of the mounting table with a protection member; sealing the vacuum processing chamber; vacuum evacuating the sealed vacuum processing chamber; and adsorbing at least one of foreign substances and out-gases by the protection member.

18 Claims, 7 Drawing Sheets

US 8,945,313 B2

VACUUM EXHAUST METHOD AND A SUBSTRATE PROCESSING APPARATUS THEREFOR

CROSS-REFERENCE TO RELATED APPLICATION

This application is a divisional application of Ser. No. 12/606,569, filed Oct. 27, 2009, which claims the benefit of priority to Japanese Patent Application No. 2008-276026, filed on Oct. 27, 2008, the entire contents of each is incorporated herein by reference.

FIELD OF THE INVENTION

The present invention relates to a vacuum exhaust method and a substrate processing apparatus therefor; and more particularly, to a vacuum exhaust method that vacuum-exhausts a vacuum processing chamber of a substrate processing apparatus.

BACKGROUND OF THE INVENTION

In a substrate processing apparatus such as a plasma ashing apparatus or a CVD (Chemical Vapor Deposition) apparatus for performing a required process on a substrate, e.g., a semiconductor substrate, a flat panel display substrate, or the like, there is known that when a vacuum processing chamber is evacuated to vacuum after maintenance accompanied by opening to the atmosphere, particle contamination is caused by, e.g., dispersion of particles.

The attachment of particles onto parts included in the chamber contaminates a substrate (hereinafter, referred to as "wafer") in subsequent processes or makes it difficult for the wafer to be adsorbed on a surface of a mounting table. This may cause a process failure or abnormal discharge.

If the interior of the chamber is evacuated while a wafer is mounted on the mounting table (hereinafter, referred to as "stage") and if mapping measurement is made after evacuation for particles attached on a surface of the wafer, a particle map is often observed which duplicates the array of gas holes of a shower head disposed to face the stage. From the above observation, it can be seen that, during evacuation, particles are dispersed from the gas holes of the shower head and attached onto the stage. Such particles in the chamber may be originated from particles entered from the external environment into the chamber during maintenance, particles remaining in a gas line, particles generated by condensation of moisture, and the like.

Furthermore, it is known that gases are released or outgassed from parts included in the chamber during evacuation. The out-gases do not only prolong an evacuation time needed to lower the inner pressure of the chamber down to a required vacuum level, but also cause problems such as process variation, abnormal discharge, or the like. The term "out-gases" used herein refers to gases released or outgassed from parts inside the processing chamber during vacuum evacuating thereof.

FIG. 13 illustrates a relationship between an amount of a species in out-gases generated from parts included in a chamber of a substrate processing apparatus and a release time thereof.

It can be seen from FIG. 13 that the species in the out-gases may include $N_2/CO$, $O_2$, and $CO_2$ in addition to moisture ($H_2O$), which have been entered from the external environment when the chamber was opened to the atmosphere. It can also be seen that the amount of released moisture is greater by at least one order of magnitude than the amount of the other released species, and thus main species of the out-gases is moisture. An alumite based material, thermally sprayed yttria based material, ceramics based material, carbon based material, or the like may be considered as a material that releases a great amount of out-gases.

There is known a technology of reducing particles generated in the chamber of the substrate processing apparatus during chamber evacuation (see, e.g., Japanese Patent Laid-open Application No. 1996-255784). The patent application supra discloses a vacuum processing method for use in an apparatus provided with a wafer stage for mounting thereon a wafer at a bottom portion of a vacuum processing chamber; a wafer stage cover for vacuum-sealing the interior of the vacuum processing chamber; a gas inlet line for introducing a gas into the sealed vacuum processing chamber that is formed by the wafer stage and the wafer stage cover; and a vacuum exhaust line for performing evacuation. In the vacuum processing method, the gas is injected from the gas inlet line to the wafer mounted on the wafer stage to blow particles off the wafer and then the particles are sucked through the vacuum exhaust line.

In the above prior art, the gas is injected toward the wafer to blow particles off the wafer, and then the particles are exhausted through the vacuum exhaust line. However, the blown particles may be attached to and remain on other parts included in the chamber so that particles may not be removed completely. Therefore, there is a need for a technology that can effectively collect particles present in the chamber and introduced into the chamber during evacuation, and adsorb out-gases generated during evacuation to remove the particles and the out-gases.

SUMMARY OF THE INVENTION

In view of the above, the present invention provides vacuum evacuating method and a substrate processing apparatus therefor, which can adsorb and remove particles and out-gases generated in a chamber during vacuum evacuation.

In accordance with a first aspect of the present invention, there is provided a vacuum exhaust method of a substrate processing apparatus including a vacuum processing chamber having therein a mounting table for mounting a target substrate thereon, the vacuum exhaust method including opening the vacuum processing chamber to the atmosphere; covering a surface of the mounting table with a protection member; sealing the vacuum processing chamber; vacuum evacuating the sealed vacuum processing chamber; and adsorbing at least one of foreign substances and out-gases by the protection member.

In accordance with a second aspect of the present invention, there is provided a substrate processing apparatus including a mounting table for mounting a target substrate thereon; a vacuum processing chamber in which the mounting table is provided; an exhaust unit for evacuating the vacuum processing chamber; and an adsorption layer coating a surface of the mounting table and, during evacuating the vacuum processing chamber, adsorbing at least one of foreign substances and out-gases.

In accordance with a third aspect of the present invention, there is provided a substrate processing apparatus including a vacuum processing chamber; a mounting table provided in the vacuum processing chamber to mount a target substrate thereon; an exhaust unit for depressurizing an interior of the vacuum processing chamber; a protection member that, during vacuum evacuation of the interior of the vacuum processing chamber by the exhaust unit, covers a surface of the mounting table, and, after vacuum evacuation by the exhaust unit, is moved to the outside of the vacuum processing chamber for waiting; and an waiting chamber for accommodating the protection member outside of the vacuum processing chamber.

BRIEF DESCRIPTION OF THE DRAWINGS

The objects and features of the present invention will become apparent from the following description of preferred embodiments, given in conjunction with the accompanying drawings, in which.

DETAILED DESCRIPTION OF THE EMBODIMENTS

Hereinafter, embodiments of the present invention will be described in more detail with reference to accompanying drawings which forms a part hereof.

Figure 1:
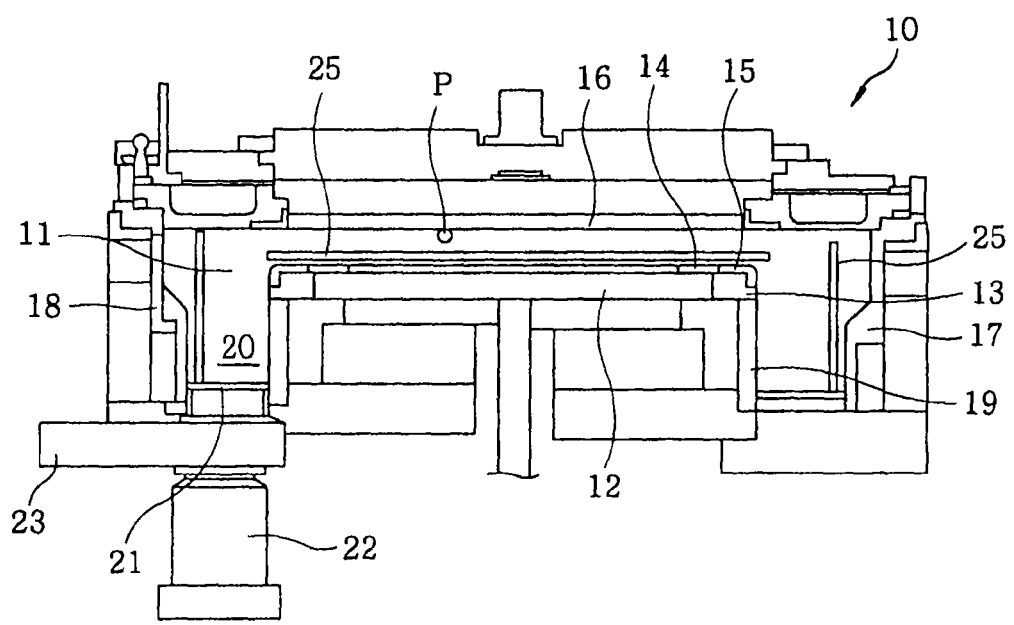
FIG. 1 is a view schematically illustrating a configuration of a substrate processing apparatus in accordance with an embodiment of the present invention.

FIG. 1 is a view schematically illustrating a substrate processing apparatus in accordance with an embodiment of the present invention.

Referring to FIG. 1, the substrate processing apparatus 10 includes a chamber (processing chamber) 11; a mounting table (stage) 12 arranged in the chamber 11 to mount a wafer W thereon; an enclosure 13 arranged along the circumference of the stage 12; a focus ring 14 and a cover ring 15 provided on top of the enclosure 13 and an outer peripheral portion of the stage 12 in a manner that they surround the wafer W (not shown); a ceiling member (shower head) 16 arranged at the upper portion of the chamber 11 opposite to the stage 12; sidewall member 17 of the chamber; a sidewall member 19 of the stage 12; and a shutter 18 provided at a transfer port through which the wafer W is loaded and unloaded into and from the chamber 11.

A gas exhaust path 20 is provided between the sidewall member 19 of the stage 12 and the sidewall member 17 of the chamber 11, and connected to a TMP (Turbo Molecular Pump) 22 via a gas exhaust plate 21. Further, an APC (Adaptive Pressure Control) valve 23 which is of a variable butterfly valve is provided between the chamber 11 and the TMP 22 to control a pressure in the chamber 11. The TMP 22 exhausts a gas or the like from the interior of the chamber 11.

In the above substrate processing apparatus when, e.g., an ashing process is performed on the wafer W, vacuum evacuation is first performed to depressurize the interior of the chamber down to a required pressure of, e.g., 1.3 Pa (10 mTorr). At this time, a surface of the stage 12 and a surface of a sidewall member 17 are covered by protection members 25 to be protected from particles P generated in the chamber.

In FIG. 1, the surface of the stage 12 which mounts the wafer W thereof is covered by a protection member 25 whose area is larger than that of the surface of the stage 12 (i.e., the diameter of the protection member 25 being greater than that of the stage 12). A surface of the sidewall member 17 that is a part included in the chamber is covered by a protection member 25 as well.

Figure 2:
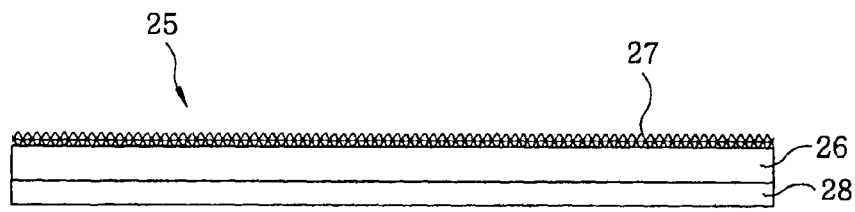
FIG. 2 is a side view of a protection member.

FIG. 2 shows a side view of a protection member 25.

Referring to FIG. 2, the protection member 25 is a plate-shaped or sheet-shaped member that adsorbs and captures particles P dispersed from, e.g., gas holes of the shower head 16 during vacuum evacuation. The protection member 25 includes a base portion 26, a trap portion 27 provided on the top surface of the base portion 26 to serve as a foreign substance adsorption layer, and an adsorption portion 28 provided on the rear surface of the base portion 26.

The trap portion 27 is formed to have, e.g., a knitted mesh structure, or a woven or a nonwoven fabric structure made of fibers, e.g., silica, alumina, or a mixture thereof. As for the mixture of silica and alumina, a mixing ratio is, e.g., 7:3. The mesh structure, or the woven or the nonwoven fabric structure allows the particles P entering into the trap portion to collide with fibrous tissues several times and consume their kinetic energies, thereby enabling the particles P to be easily captured.

The base portion 26 is made of a material, e.g., quartz, silicon, or the like, that hardly outgases. Further, it is not desirable to adopt Cu or the like as the material constituting the base portion 26 because such material may cause contamination in the wafer W.

The adsorption portion 28 on the rear surface of the base portion 26 is made of an adhesive or adsorptive resin sheet such as a polyimide sheet. The adsorption portion 28 contacts a surface of a member to be protected, e.g., the stage 12 and adsorbs and detaches particles attached thereon. An adhesive surface (rear surface) of the adsorption portion 28 is formed to have an uneven surface that is conformal to the shapes of the top surface of stage 12 and surfaces of the focus ring 14 and the cover ring 15 surrounding the top surface of the stage 12 to thereby be in tight contact therewith.

The top surface of the stage 12 and the surface of the sidewall member 17 are covered by the protection members 25 configured as described above. And then, the vacuum evacuation is performed by, e.g., closing a shutter 18, activating the TMP 22, and exhausting the gases from the interior of the chamber 11 via the gas exhaust plate 21. At this time, particles P introduced into the chamber 11 from the gas holes (not shown) of the shower head 16, they collide with and are captured by the trap portion 27 of each of the protection members 25 arranged to cover the top surface of the stage 12 and the surface of the sidewall member 17.

With this embodiment, particles P generated during vacuum evacuation can be captured by the trap portions 27 of each of the protection members 25 disposed on the top surface of stage 12 and to cover the surface of the sidewall member 17. Therefore, it is possible to prevent particle contamination that may occur during vacuum evacuation and stabilize subsequent processes.

Moreover, since a self-cleaning effect can be achieved in the inside of the substrate processing apparatus 10, apparatus assembling or maintenance accompanied by opening to the atmosphere, which conventionally needed to be performed in a clean room at a high degree of cleanness, may be carried out at a lower degree of cleanness.

In the present embodiment, the members included in the chamber (referred to as "in-chamber members" herein after) which are covered by the protection members 25 are not limited to the stage 12 and the sidewall member 17, but may include other members, e.g., the sidewall member 19 of the stage 12, a shield ring, and the like, which are needed to be protected from the attachment of particles P.

Further, in the embodiment, the trap portion 27 of the protection member 25 may be formed in a multi-layer structure. With this configuration, when adsorptive power of a first trap layer adsorbing the particles P is weakened, the first trap layer is detached to allow a second trap layer to be exposed and used. As such, the trap portion 27 may be configured to have multiple trap layers that may be sequentially detached and used.

In the embodiment, it may be preferable that the gap between the protection member 25 and the in-chamber members to be protected thereby, e.g., the top surface of the stage 12 is made to be smaller. The protection member 25 is disposed directly on the stage 12 by using, e.g., an arm mechanism. Thus, it is possible to avoid contamination due to particles P entering in between the protection member 25 and the top surface of the stage 12. Further, although it can be considerable that the protection member 25 is contact with the stage 12, the protection member 25 may be preferably made not to be in contact with the stage 12.

In the embodiment, the protection member 25 may also have a cooling function.

Figure 3:
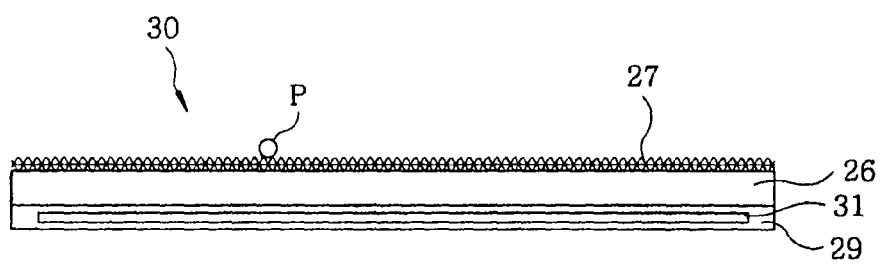
FIG. 3 is a view illustrating a variation of the protection member shown in FIG. 2.

FIG. 3 illustrates a variation of the protection member 25 shown in FIG. 2.

Referring to FIG. 3, a protection member 30 includes a cooling adsorption portion 29 which is formed by embedding, e.g., a peltier element 31 serving as a cooling unit in the adsorption portion 28 shown in FIG. 2.

The protection member 30 thus configured is arranged to cover the top surface of the stage 12 in the chamber 11. Then, the vacuum evacuation is performed while the cooling adsorption portion 29 is being cooled such that the temperature difference between the cooling adsorption portion 29 and the interior of the chamber is, e.g., 0□ to −20□. As a result, a temperature difference occurs between particles P generated during vacuum evacuation and the trap portion 27 cooled by the cooling adsorption portion 29 of the protection member 30 and a thermophoretic force is exerted on the particles P such that the particles P are pulled toward the trap portion 27 of the protection member 30. Accordingly, the efficiency of capturing the particles P by the trap portion 27 is improved.

The thermophoretic force is used herein may be defined as follows. When a large temperature gradient occurs in a space where particles exist, a momentum of gaseous molecules colliding with the particles increases at a high temperature side in comparison with a low temperature side. That is, particles are subjected to a force oriented from the high temperature side to the low temperature side. Such a force as exerted on the particles is called "thermophoretic force".

Alternatively, the efficiency of capturing the particles P may be improved by charging the protection member.

Figure 4:
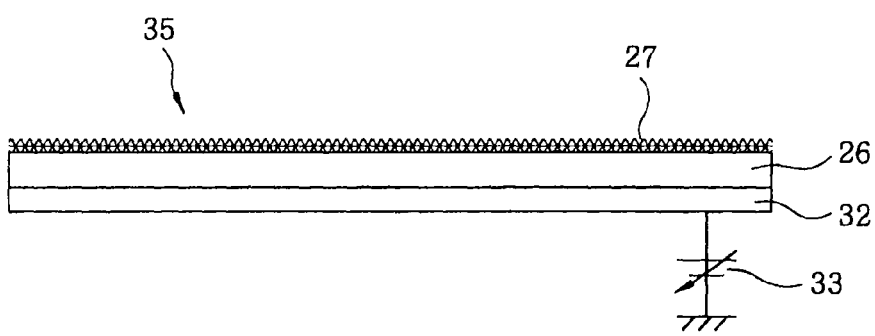
FIG. 4 is a view illustrating another variation of the protection member shown in FIG. 2.

FIG. 4 shows a variation of the protection member 25 shown in FIG. 2.

Referring to FIG. 4, a protection member 35 has a charging adsorption portion 32 instead of the adsorption portion 28 included in the protection member 25 shown in FIG. 2. The charging adsorption portion 32 is electrically connected to, e.g., a DC power supply 33.

In this configuration, the protection member 35 having the charging adsorption portion 32 is arranged to cover the top surface of the stage 12 in the chamber 11. Thereafter, a positive or a negative DC voltage is applied to the charging adsorption portion 32 of the protection member 35 so that its polarity becomes opposite to that of particles electrically charged. Then, an electrostatic force is exerted on the particles P, which leads to enhancing capturing efficiency of particles P. At this time, the DC voltage applied to the charging adsorption unit 32 ranges, e.g., from −5 kV to +5 kV.

In this embodiment, a porous member having an adsorption function, such as an activated carbon layer, an alumina layer, or the like, may be employed as the base portion 26 of each of the protection members 25, 30, and 35. When the porous layer is adopted as the base portion 26, out-gases released from the in-chamber members during vacuum evacuation can be adsorbed. Each of the protection members 25, 30, and 35 conducts two functions, i.e., capturing the particles by a trap portion 27 in the top surface and adsorbing the out-gases by the base portion 26.

The out-gases are generally released from porous in-chamber members which include yttria, ceramics, or the like.

In this embodiment, the trap portion 27 of the protection member 25 may be made of a gas adsorption material to capture particles and adsorb out-gases.

Figure 5:
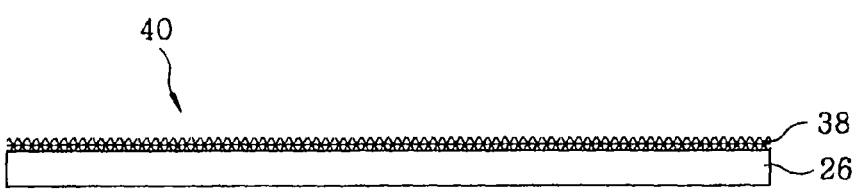
FIG. 5 is a view illustrating still another variation of the protection member shown in FIG. 2.

FIG. 5 is a view illustrating a variation of the protection member 25 shown in FIG. 2.

Referring to FIG. 5, a protection member 40 includes a trap portion 38 instead of the trap portion 27 of the protection member 25 shown in FIG. 2. The trap portion 38 is made of a porous member having a large surface area, such as activated carbon, porous ceramic, or the like, e.g., in a mesh structure to provide a gas adsorptive function.

The protection member 40 thus configured is arranged to cover the top surface of the stage 12 in the chamber 11. Thus, particles P (solid) released from, e.g., gas holes of the shower head and introduced into the chamber 11 and out-gases (molecules) generated from in-chamber members during vacuum evacuation are simultaneously captured and adsorbed by the trap portion 38 with a gas adsorptive function and removed.

Since the trap portion 38 is formed of mesh-structured activated carbon, or a woven or a nonwoven fabric-structured carbon fibers, the foreign particles and the out-gases generated during vacuum evacuation can be adsorbed and removed with high efficiency.

In this embodiment, a waiting chamber is provided adjacent to the processing chamber to which the protection member is installed. Accordingly, when necessary, the protection member can be loaded from the waiting chamber into the processing chamber, and when unnecessary, the protection member may be withdrawn into the waiting chamber.

Since the protection member can be withdrawn into the waiting chamber after the vacuum evacuation, the subsequent processes on the substrate are not be interfered by the protection member.

Figure 6:
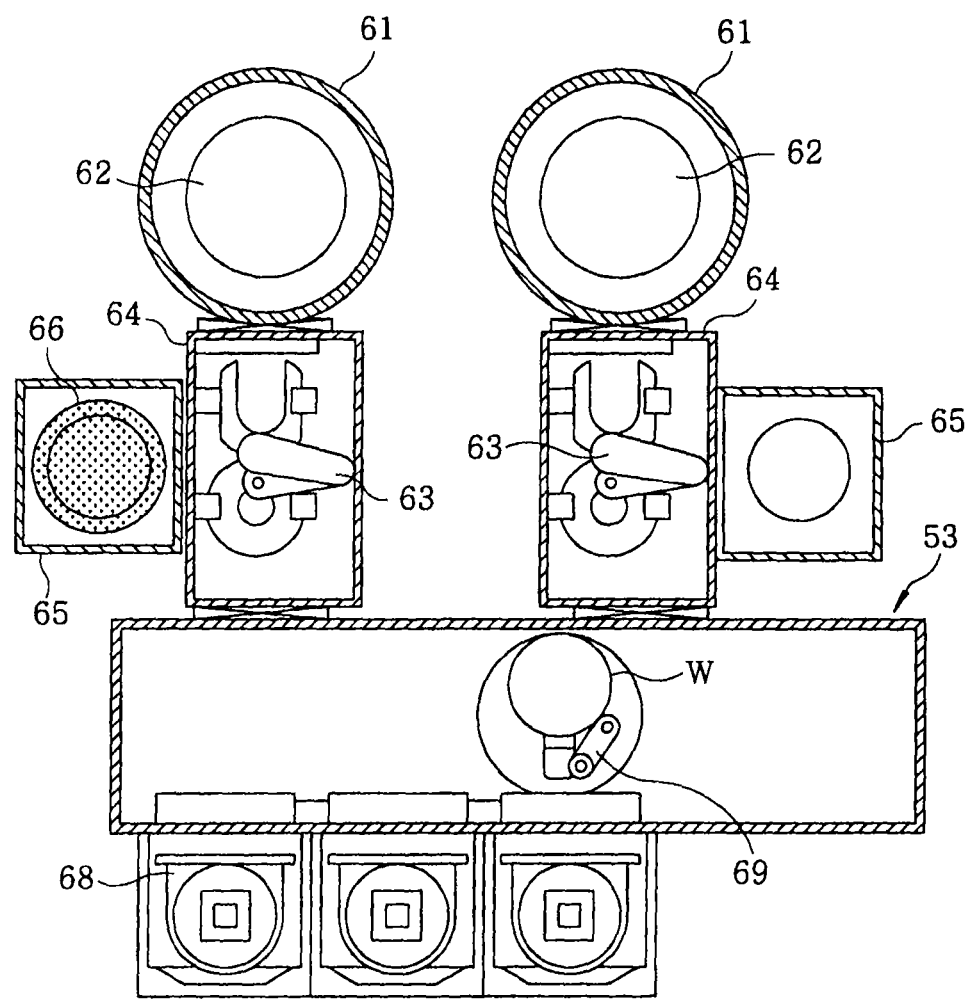
FIG. 6 schematically illustrates an arrangement relationship between a vacuum processing chamber vacuum and a waiting chamber which is provided adjacent to the processing chamber and serves as an area for accommodating a protection member.

FIG. 6 schematically illustrates a configuration of a substrate processing system that includes a processing chamber where a vacuum evacuation is performed and a waiting chamber that is provided adjacent to the processing chamber and serves as an area for accommodating a protection member.

Referring to FIG. 6, the substrate processing system includes two process ships, each of which include a process module 61, a processing chamber 62 provided in the process module 61, a load lock module 64 having a transfer arm 63 for loading a wafer W into the processing chamber 62, a waiting chamber 65 for a protection member 66 provided adjacent to the load lock module 64. The substrate processing system further includes a loader module 53 serving as a common transfer chamber to which the two process ships are connected, and a transfer arm 69 provided in the loader module 53 to pick up a wafer W from a hoop 68 and transfer it to a load lock module 64.

In the substrate processing system thus configured, the protection member 66, is transferred, when not used, for standby from the processing chamber 62 to the waiting chamber 65 by the transfer arm 63 provided in the load lock module 64. When used, the protection member 66 is loaded from the waiting chamber 65 to the processing chamber 62.

In this embodiment, a protection member regenerating unit may be provided in the waiting chamber 65 to release particles P and out-gases from the protection member 66 on which the particles P and the out-gases are attached. Accordingly, the protection member can be reused repeatedly.

Figure 7:
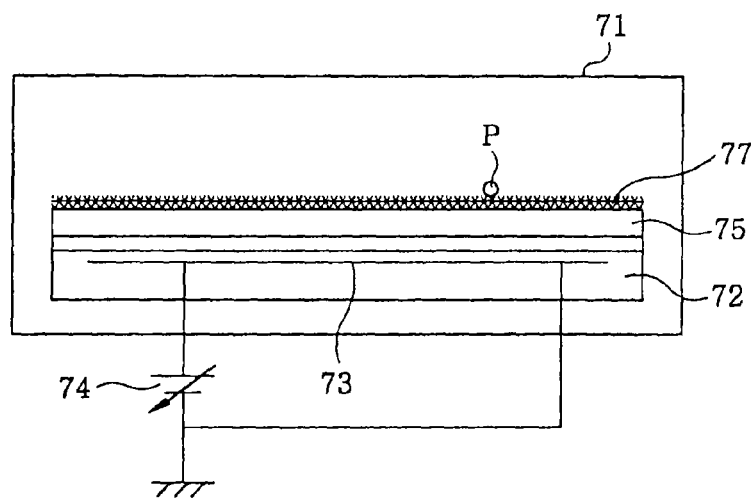
FIG. 7 is an explanatory diagram illustrating an example of protection member regenerating unit provided in the waiting chamber.

FIG. 7 is a view illustrating an example of the protection member regenerating unit provided in the waiting chamber.

Referring to FIG. 7, a heating table 72 is provided in a waiting chamber 71 to heat a protection member 75 on which particles P and out-gases are adsorbed. The heating table 72 has therein an electric heater 73 which electrically connected to, e.g., a DC power supply 74.

With this configuration, the protection member 75 on which particles P and out-gases are adsorbed is loaded into the waiting chamber 71 and is mounted on the heating table 72 to be heated to, e.g., 100☐~150☐ by the electric heater 73. When the protection member 75 is heated, the particles P collected in a trap portion 77 thereof are also heated so that a temperature gradient occurs in a space surrounding the particles P. That is, the temperature gradient is generated such that the temperature at the protection member side of the particles P (lower side in FIG. 7) is high and that at the side of the particles P opposite to the protection member (upper side in FIG. 7) is low.

Due to such temperature gradient, a thermophoretic force is exerted on the particles P, from the surface of the protection member 75 at the higher temperature to at the lower temperature above the protection member 75. Accordingly, the particles P are detached from the surface of the trap portion 77 and released along with the out-gases, thereby regenerating the protection member 75.

In this embodiment, an ultrasonic vibrating process may be conducted as well when the heating process is performed in order to regenerate the protection member.

Figure 8:
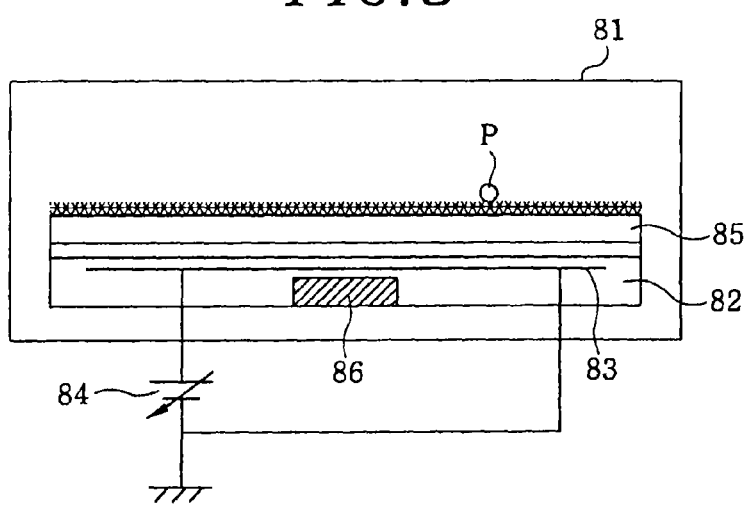
FIG. 8 is an explanatory diagram illustrating another example of protection member regenerating unit provided in the waiting chamber.

FIG. 8 illustrates another example of protection member regenerating unit which is applied in the waiting chamber.

The protection member regenerating unit shown in FIG. 8 is different from the protection member regenerating unit shown in FIG. 7 in that the heating table 72 is replaced with a heating and vibrating table 82 in which an ultrasonic oscillator 86 and an electric heater 83 are embedded.

With this configuration, an used protection member 85 is transferred and mounted on the heating and vibrating table 82 in a waiting chamber 81. Then, while the protection member 85 is being heated to 100☐ to 150☐ by the electric heater 83 under a pressure of, e.g., 1.3 kPa (10 Torr) in the waiting chamber, the protection member 85 is vibrated by an ultrasonic oscillator 86. As a consequence, the particles P and the out-gases are detached from the protection member 85, and the protection member 85 is regenerated. The particles P and the out-gases released in the waiting chamber 81 are subjected to vacuum evacuation by a dry pump. Further, a gas adsorption mechanism, such as Cryo pump or the like, may be separately provided.

When the ultrasonic vibrating process is conducted together with the heating process, an adhesive force of the particles P onto the protection member 85 may be smaller than when only the heating process is performed. Accordingly, the particles P are easily detached from the protection member 85, thereby improving regeneration efficiency. A frequency of the ultrasonic wave generated by the ultrasonic oscillator is, e.g., 1~100 kHz.

In this embodiment, when the protection member is regenerated, a light irradiating process may be performed together with the heating process.

Figure 9:
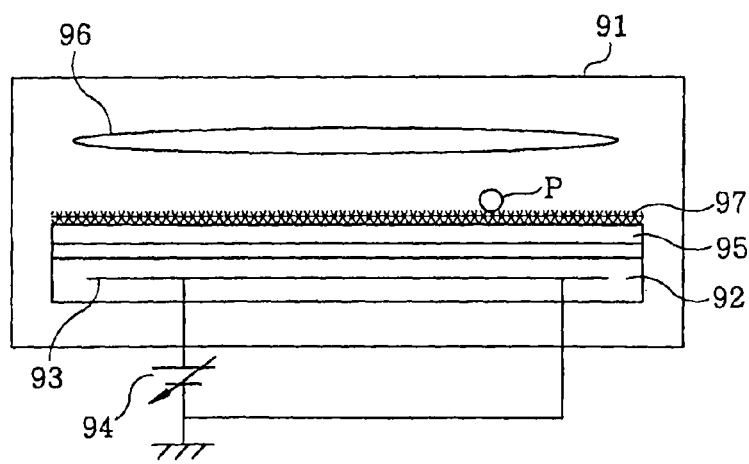
FIG. 9 is an explanatory diagram illustrating still another example of protection member regenerating unit provided in the waiting chamber.

FIG. 9 presents still another example of the protection member regenerating unit provided in a waiting chamber. The protection member regenerating unit shown in FIG. 9 is different from the protection member regenerating unit shown in FIG. 7 in that a light source 96 is further provided above and opposite to the heating table 92 to irradiate a protection member 95 to be processed.

In this configuration, the used protection member 95 is mounted on top surface of a heating table 92. Then, while the protection member 95 is heated in 100☐~150☐ by an electric heater 93 under a pressure of, e.g., 1.3 kPa (10 Torr) in the waiting chamber, an electromagnetic wave whose frequency is, e.g., 100 kHz is irradiated on a surface of the protection member 95 by the light source 96. Accordingly, particles P are detached from the protection member 95, thereby regenerating the protection member 95.

With the above configuration that the heating process is performed together with the light irradiating process, the particles P attached on the trap portion 97 of the protection member 95 is subjected to a micro vibration, thereby reducing an adhesive force of the particles P to the trap portion 97. Thus, the particles P can be easily detached from the protection member 95.

In this case, an infrared laser beam may be irradiated to the particles P that are attached on the surface of the protection member 95. As irradiated with the infrared laser light, the particles P absorb the infrared light which makes thermal vibration much stronger. Accordingly, an adhesive force of the particles P to the protection member 95 is weakened such that the particles P can be easily detached from the surface of the protection member 95.

Further, out-gases adsorbed onto the protection member 95 also can be easily detached from the surface of the protection member 95. The particles P and the out-gases detached from the protection member 95 are subjected to vacuum evacuation by a dry pump separately.

In this embodiment, short wavelength light, e.g., UV (Ultra Violet) light or EUV (Extreme Ultra Violet) light may be irradiated onto a surface of the protection member 95 by the light source 96. As irradiated with the short wavelength light, the particles P are vibrated by energy of the short wavelength light. Accordingly, an adhesive force of the particles P to the protection member 95 is weakened such that the particles P can be easily blown and detached from the surface of the protection member 95. Further, the out-gases adsorbed onto the protection member 95 can be easily detached from the surface of the protection member 95.

In this embodiment, when the protection member is regenerated, a gas inject process may be employed.

Figure 10:
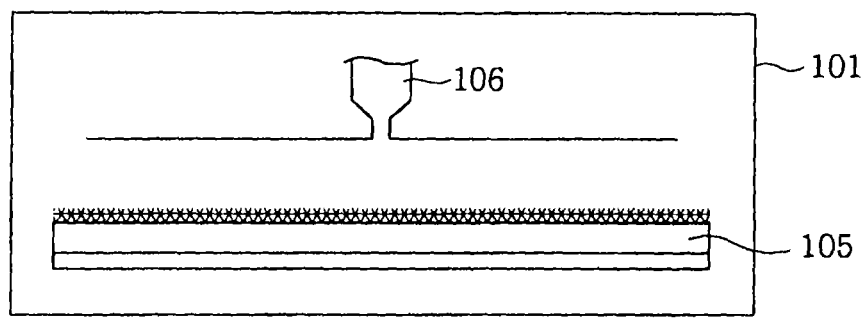
FIG. 10 is an explanatory diagram illustrating yet still another example of protection member regenerating unit provided in the waiting chamber.

FIG. 10 illustrates yet still another example of the protection member regenerating unit provided in a waiting chamber.

Referring to FIG. 10, the protection member regenerating unit is further provided with a gas inject nozzle 106 for spraying a cleaning gas to a surface of a protection member 105.

With this configuration, a cleaning gas such as $N_2$ gas, Ar gas, $CO_2$ gas, or the like is sprayed at a speed of 1000 ml/sec to a surface of the used protection member 105 loaded in the waiting chamber, thereby detaching particles P from the surface of the protection member 105. Further, if out-gases are adsorbed on the protection member 105, the out-gases also are released such that the protection member 105 is regenerated.

With the gas inject process, the particles P and the out-gases collected and adsorbed on the protection member 105 can be easily detached, thereby regenerating the protection member 105. The particles P and the out-gases detached from the protection member 105 are subjected to vacuum evacuation by a dry pump separately.

In this embodiment, when the protection member is regenerated, an aerosol inject process may be employed.

Figure 11:
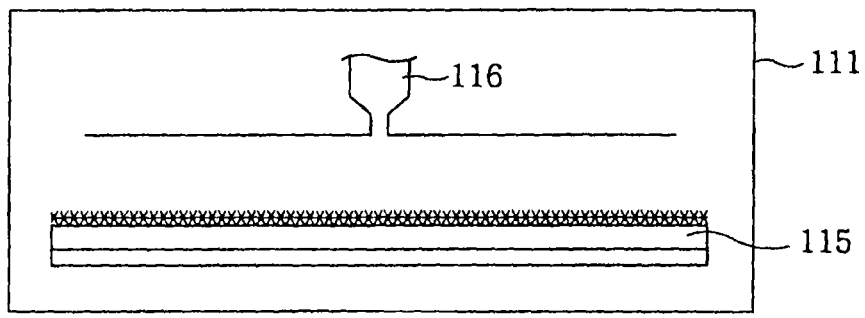
FIG. 11 is an explanatory diagram illustrating a further example of protection member regenerating unit provided in the waiting chamber.

FIG. 11 shows yet still another example of the protection member regenerating unit provided in a waiting chamber.

The protection member regenerating unit shown in FIG. 11 is different from the protection member regenerating unit shown in FIG. 10 in that an aerosol inject nozzle 116 is provided instead of the gas inject nozzle 106. An aerosol refers to tiny liquid or solid substances that float in gas, e.g., steam as a liquid aerosol and $CO_2$ blast as a solid aerosol.

With this configuration, an aerosol is sprayed from an aerosol inject nozzle 116 onto a surface of the used protection member 115 loaded in the waiting chamber 111, so that the particles and the out-gases collected and adsorbed on the protection member 115 are detached therefrom, thereby regenerating the protection member 115. The particles P and the out-gases detached from the protection member 115 are subjected to vacuum evacuation by a dry pump separately.

Further, when the aerosol inject process is applied, an aerosol, e.g., steam or $CO_2$ blast may be injected to a surface of the used protection member 115, so that the particles P and the out-gases collected and adsorbed on the protection member 115 are detached from the protection member 115, thereby regenerating the protection member 115.

In this embodiment, a shock wave of a gas may be employed. That is, the shock wave is applied to the used protection member by a well-known method, so that the collected particles P and out-gases are detached and released.

In accordance with the embodiment of the present invention, when the load lock module of the substrate processing system is evacuated, the above-described protection member may be used to prevent contamination of the transfer arm which is caused by the particles P or the like generated during vacuum evacuation.

Another embodiment of the present invention will be hereinafter described.

Figure 12:
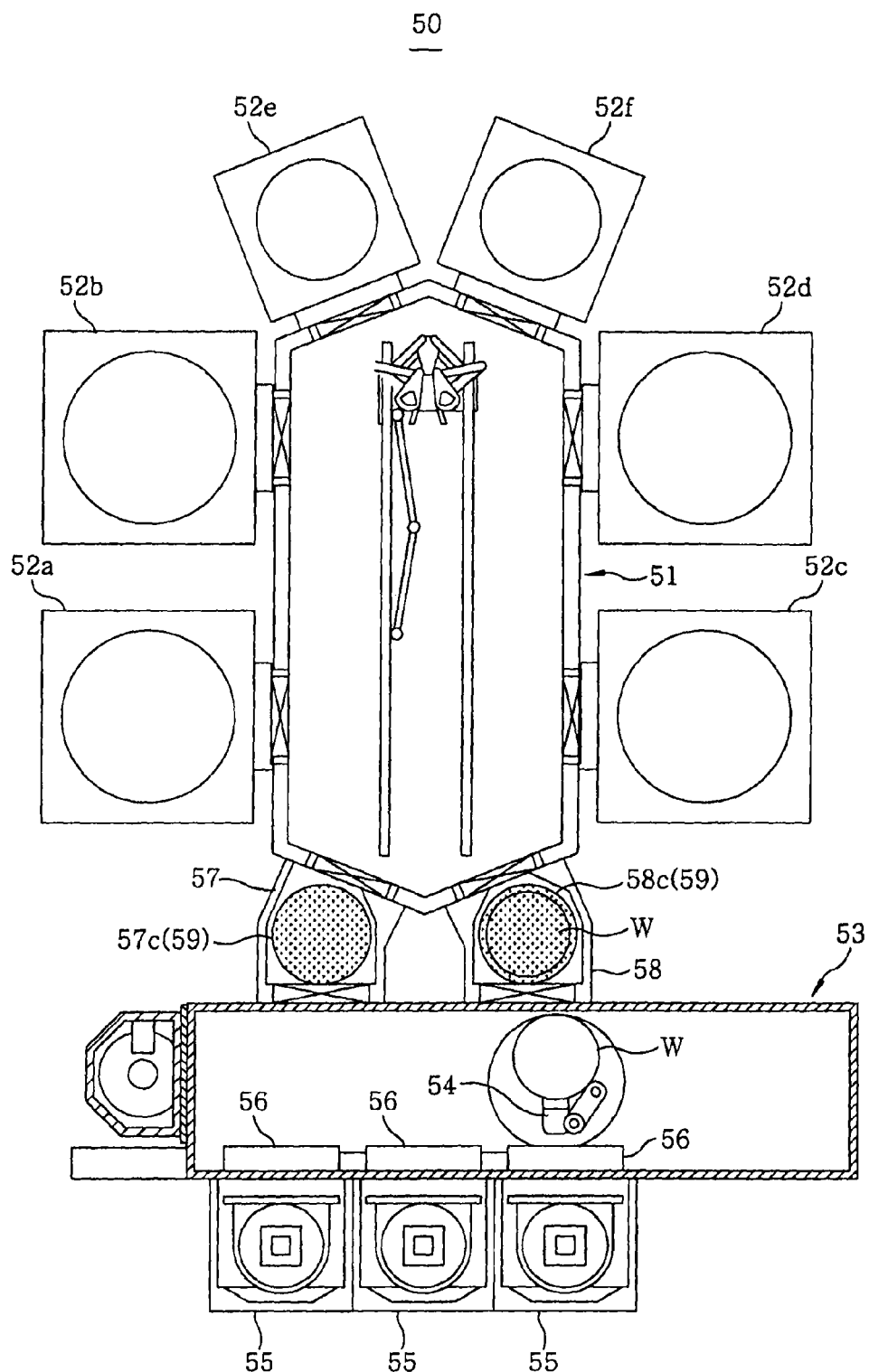
FIG. 12 schematically shows a configuration of an example of a substrate processing system.
Figure 13:
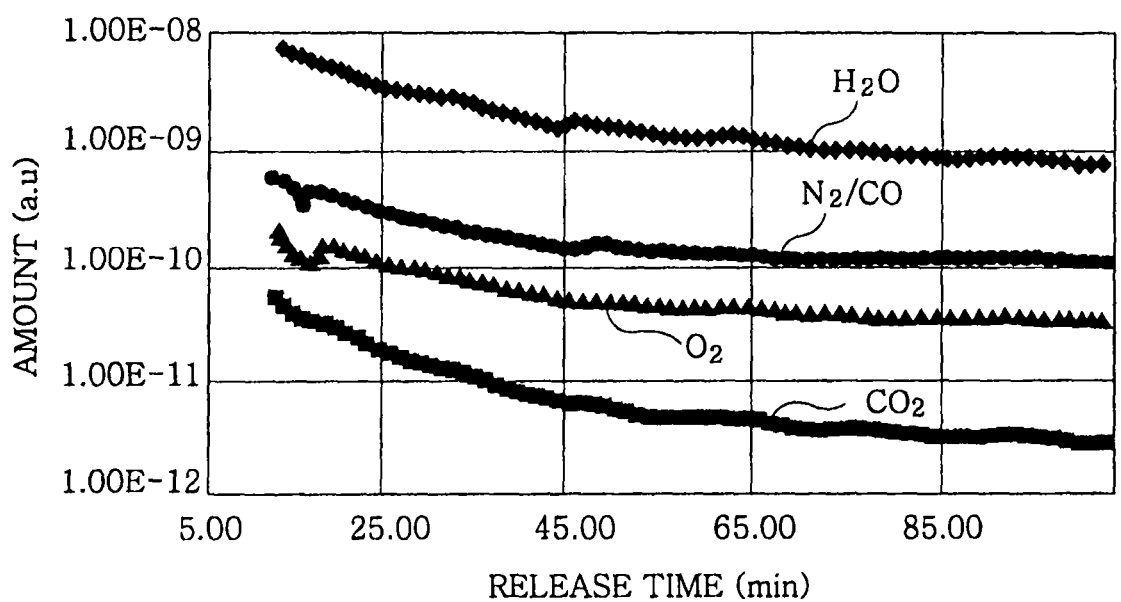
FIG. 13 is a view illustrating a relationship between an amount of species in out-gases and a release time thereof, the out-gases being generated from parts included in a chamber of a substrate processing apparatus during vacuum evacuation.

FIG. 12 schematically illustrates an example of configuration of a substrate processing system.

Referring to FIG. 12, the substrate processing system 50 includes a transfer module 51 which is hexagonal in a plan view; a plurality of process modules 52a to 52f arranged at a peripheral portion of the transfer module 51; a rectangular loader module 53 that is disposed by the transfer module 51 and serves as a transfer chamber; and load lock modules 57 and 58 arranged between the transfer module 51 and the loader module 53 to connect therebetween. The loader module 53 includes a transfer arm 54 and a load port 56 arranged at a connection portion between the loader module 53 and each hoop mounting tables 55.

In the substrate processing system thus configured, wafer mounting tables 57c and 58c serving as wafer transfer members are provided in the load lock modules 57 and 58, respectively, and are overcoated by a protection member 25.

In the substrate processing system 50, while an inside of the loader module 53 is maintained as an atmospheric pressure, an inside of the transfer module 51 is maintained in a vacuum. Therefore, each of the load lock modules 57 and 58 is provided with a vacuum gate valve at a connection portion to which the transfer module 51 is connected, and an atmospheric door valve at a connection portion to which the loader module 53 is connected. Each load lock modules serves as a preliminary vacuum transfer chamber whose inner pressure can be adjusted. The load lock modules 57 and 58 are subjected to vacuum evacuation if necessary and, therefore, the wafer mounting tables 57c and 58c are coated by a protection member 59 in order to prevent contamination of the wafer mounting tables due to particles P entering into the load lock modules during vacuum evacuation.

With this embodiment, the wafer mounting tables 57c and 58c which are wafer transfer members are coated by the protection member 59 when the load lock modules 57 and 58 of the substrate processing system 50 are evacuated. Accordingly, it is possible to certainly prevent particles P generated during vacuum evacuation from being attached onto the mounting tables 57c and 58c, and resultant contamination of the mounting tables 57c and 58c.

In this embodiment, the protection member 59 may be preferably formed as a plate that has the same shape as and whose diameter is larger than that of a wafer mounted on each of the wafer mounting tables 57c and 58c in order to entirely cover the wafer, for example, the dimension of the protection member 59 may be 10% larger than that of the wafer. The protection member 59 may be of mesh-structured porous material made of, for example, activated carbon to adsorb particles P generated in the load lock modules 27 and 28 during vacuum evacuation and substantially simultaneously adsorb out-gases generated from in-chamber members. Accordingly, a time required for evacuating the load lock modules 27 and 28 can be prevented from being increased. Further, since the protection member 59 does not interfere with transfer of the wafer W, it does not need to be withdrawn after vacuum evacuation.

In the above-described embodiments, a substrate to be processed is not limited to a wafer for a semiconductor device, but may be various substrates used for LCDs (Liquid Crystal Displays) or FPDs (Flat Panel Displays), photomasks, CD substrates, print boards, or the like.

Further, characteristic configurations of the above embodiments, e.g., structure and material of a foreign substance adsorption layer and an out-gases adsorption layer included in the protection member, an application of a cooling unit and a charging unit, an application of violation to the wafer W by ultrasonic wave or by light irradiation at the regeneration heating process of the protection member, or the like may be applied independently or in a combination of two or more thereof.

Moreover, in accordance with another aspect of the present invention, there is provided a storage medium storing program codes of software capable of implementing functions of each of the above-mentioned embodiments, which is supplied to a system or device whose computer (or CPU, MPU, etc.) may read and executes the program codes stored in the storage medium.

In this case, the program codes themselves, which are read from the storage medium, realize the functions of each of the above-described embodiments, and the program codes and the storage medium storing the program codes fall within a scope of the present invention.

Further, the storage medium storing program codes may include, for example, floppy (registered trademark) discs, hard discs, magneto-optical discs, optical discs such as CD-ROMs, CD-Rs, CD-RWs, DVD-ROMs, DVD-RAMs, DVD-RWs, DVD+RWs, or the like, magnetic tapes, non-volatile memory cards, ROMs, and the like. Alternatively, the program codes may be downloaded over a network.

The functions of each of the above-described embodiments may be implemented by executing the program codes read by the computer, or by executing a part or all of actual processes by OS (Operating System) operating in the computer based on commands of the program codes.

The program codes read from the storage medium may be written in a memory provided in a function extension board inserted in the computer or a function extension unit connected to the computer. Then, the functions of each of the above-described embodiments may be implemented by allowing a CPU provided in the extension board or extension unit to execute a part or all of actual processes for an extension function based on commands of the program codes.

While the invention has been shown and described with respect to the embodiments, it will be understood by those skilled in the art that various changes and modifications may be made without departing from the scope of the invention as defined in the following claims.

What is claimed is:

1. A vacuum exhaust method of a substrate processing apparatus including a vacuum processing chamber having therein a mounting table for mounting a target substrate thereon, the vacuum exhaust method comprising:
    opening the vacuum processing chamber to the atmosphere;
    covering a surface of the mounting table with a protection member;
    sealing the vacuum processing chamber;
    vacuum evacuating the sealed vacuum processing chamber; and
    adsorbing at least one of foreign substances and out-gases by the protection member,
    wherein the protection member includes:
    a base portion;
    a trap portion provided on a top surface of the base portion, the trap portion having a mesh structure, or a woven or a nonwoven fabric structure; and
    an adsorption portion provided on a bottom surface of the base portion, the adsorption portion facing the surface of the mounting table and adsorbing and detaching particles attached on the mounting table when the protection member covers the mounting table.

2. The vacuum exhaust method of claim 1, wherein said vacuum evacuating includes cooling the protection member to exert a thermophoretic force on a foreign substance being adsorbed in the protection member.

3. The vacuum exhaust method of claim 1, wherein the vacuum evacuating includes charging the protection member to apply an electrostatic force to a foreign substance being adsorbed in the protection member.

4. The vacuum exhaust method of claim 1, wherein after the vacuum evacuating, the protection member is accommodated in a waiting chamber outside the vacuum processing chamber, and before vacuum evacuating the vacuum processing chamber again, the protection member is unloaded from the waiting chamber and loaded in the vacuum processing chamber.

5. The vacuum exhaust method of claim 4, further comprising regenerating a used protection member in the waiting chamber.

6. The vacuum exhaust method of claim 5, wherein said regenerating includes blowing a gas or an aerosol to the used protection member to remove said at least one of the foreign substances and the out-gases adsorbed in the protection member.

7. The vacuum exhaust method of claim 5, wherein said regenerating includes heating the used protection member to exert a thermophoretic force on the foreign substances adsorbed in the protection member so that the foreign substances are detached from the protection member.

8. The vacuum exhaust method of claim 7, wherein said heating includes applying an ultrasonic wave to the protection member to vibrate a surface of the protection member.

9. The vacuum exhaust method of claim 7, wherein the heating includes irradiating light onto the protection member to cause thermal vibration or energy vibration to vibrate a surface of the substrate.

10. The vacuum exhaust method of claim 2, wherein the vacuum evacuating includes charging the protection member to apply an electrostatic force to a foreign substance being adsorbed in the protection member.

11. The vacuum exhaust method of claim 1, wherein the base portion is made of a porous material configured to adsorb a gas.

12. The vacuum exhaust method of claim 1, wherein the trap portion is made of a porous material configured to adsorb a gas.

13. The vacuum exhaust method of claim 1, wherein the adsorption portion is made of an adhesive resin sheet or an adsorptive resin sheet.

14. The vacuum exhaust method of claim 1, wherein the trap portion is made of silica, alumina or a mixture of silica and alumina.

15. The vacuum exhaust method of claim 11, wherein the adsorption portion is made of an adhesive resin sheet or an adsorptive resin sheet.

16. The vacuum exhaust method of claim 12, wherein the adsorption portion is made of an adhesive resin sheet or an adsorptive resin sheet.

17. The vacuum exhaust method of claim 11, wherein the trap portion is made of silica, alumina or a mixture of silica and alumina.

18. The vacuum exhaust method of claim 13, wherein the trap portion is made of silica, alumina or a mixture of silica and alumina.

* * * * *